(12) United States Patent
Scheikl et al.

(10) Patent No.: US 7,369,382 B2
(45) Date of Patent: May 6, 2008

(54) INTEGRATED CIRCUIT WITH AN UNDERVOLTAGE DETECTOR

(75) Inventors: Erich Scheikl, Villach (AT); Heinz Zitta, Drobollach (AT)

(73) Assignee: Infineon Technologies AG, Munich (DE)

(*) Notice: Subject to any disclaimer, the term of this patent is extended or adjusted under 35 U.S.C. 154(b) by 98 days.

(21) Appl. No.: 11/304,494

(22) Filed: Dec. 14, 2005

(65) Prior Publication Data
US 2006/0158808 A1    Jul. 20, 2006

(30) Foreign Application Priority Data
Dec. 14, 2004   (DE) .................. 10 2004 060 211

(51) Int. Cl.
*H02H 3/24* (2006.01)
(52) U.S. Cl. .......................................... 361/90
(58) Field of Classification Search .............. 361/90, 361/92
See application file for complete search history.

(56) References Cited
U.S. PATENT DOCUMENTS 6,472,848 B2 * 10/2002 Stryker et al. ............. 320/135
7,149,068 B2 * 12/2006 Adragna et al. ............ 361/92
2005/0050370 A1 * 3/2005 Vyssotski et al. ........... 713/300

FOREIGN PATENT DOCUMENTS

EP         0 563 924 A1     10/1993
EP         1 469 581 A1     10/2004

* cited by examiner

*Primary Examiner*—Michael Sherry
*Assistant Examiner*—Scott Bauer
(74) *Attorney, Agent, or Firm*—Maginot, Moore & Beck (57) ABSTRACT

An integrated circuit arrangement includes connection terminals, an undervoltage detector, and at least one circuit unit. The connection terminals are configured to receive a supply voltage. The undervoltage detector is coupled between the connection terminals and is configured to compare the supply voltage with a select reference value selected from a first reference value and a second reference value. The second reference value is less than the first reference value. The undervoltage detector is further operable to produce a detector signal on the basis of a result of the comparison. The circuit unit is coupled between the connection terminals, and includes a first operating state with a first drawn current and a second operating state with a second drawn current. The second drawn current exceeds the first drawn current. The select reference value corresponds to an operating state of the at least one circuit unit.

20 Claims, 5 Drawing Sheets

INTEGRATED CIRCUIT WITH AN UNDERVOLTAGE DETECTOR

The present invention relates to an integrated circuit with an undervoltage detector.

It is sufficiently well known for integrated circuits to be provided with undervoltage detectors which serve to identify a drop in a supply voltage supplied to the integrated circuit in order to disconnect the circuit if appropriate or to transfer it to a prescribed "safe" state.

Figure 1:
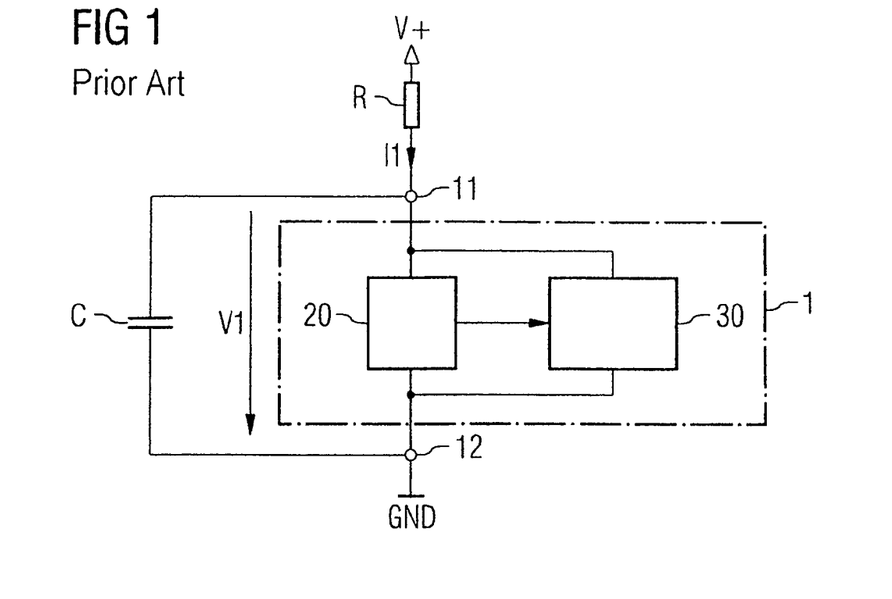
FIG. 1 schematically shows an integrated circuit arrangement with an undervoltage detector based on the prior art.

An integrated circuit with connection terminals 11, 12 for applying a supply voltage and an undervoltage detector 20 connected in the integrated circuit between the supply voltage terminals is shown schematically in FIG. 1. The connection terminals 11, 12 are used to supply power to further circuit components which are present in the integrated circuit 1 and which are shown schematically as a circuit block 30 in FIG. 1. The undervoltage detector 20 is designed to monitor the supply voltage V1 applied between the connection terminals 11, 12 and to disconnect the other circuit components 30, for example, if an undervoltage is detected, i.e. if this voltage drops below a prescribed value.

To protect against brief voltage spikes in a supply voltage V+, for example brought about by electrostatic discharges, it is known practice to connect integrated circuits to terminals of a supply voltage source not directly but rather via a series resistor. Such a series resistor is denoted by the reference symbol R in the circuit shown in FIG. 1 and is connected between one of the connection terminals and a node which is at the supply voltage V+ relative to a reference-ground potential GND. In combination with a protective capacitor C connected in parallel with the integrated circuit 1, this series resistor R prevents brief voltage fluctuations from causing the rms supply voltage V1 for the circuit to rise unconditionally as a result of the voltage spike in the supply voltage.

For operating states of the circuit 1 in which an increased supply current I1 flows briefly into the circuit, this series resistor R may result in the rms supply voltage V1 dropping to a value at which the undervoltage detector 20 responds, however.

To avoid this, the undervoltage detector 20 may be designed such that it reacts to a drop in the rms supply voltage V1 below a prescribed threshold value only after a time delay. However, this delay also prompts a reaction to a drop in the rms supply voltage V1 which results from a disturbance in the voltage supply only after a time delay.

It is therefore an aim of the present invention to provide an integrated circuit having an undervoltage detector which is able to react quickly to a disturbance-related drop in a supply voltage applied to connection terminals of the integrated circuit.

This aim is achieved by a circuit in accordance with claim 1. Advantageous refinements of the invention are the subject matter of the subclaims.

The inventive circuit arrangement comprises connection terminals for applying a supply voltage, an undervoltage detector which is connected between the connection terminals and which produces a detector signal, and at least one load circuit unit which is connected between the connection terminals and which assumes at least one first operating state with a first drawn current or a second operating state with a second drawn current, which is increased in comparison with that of the first operating state. The undervoltage detector is designed to compare the supply voltage with a first reference value or with a second reference value, which is smaller than the first reference value, depending on the operating state of the at least one circuit unit, in order to produce the detector signal.

The detector signal is preferably a binary signal whose signal level indicates a drop in the supply voltage below the respective reference value. Such a drop in the supply voltage below the respective reference value is called the fault state below.

If this circuit arrangement uses the operating state of the at least one circuit unit provided as a load to identify that there is an increased drawn current, the supply voltage applied between the connection terminals is compared with the smaller second reference value. This lowers the threshold at which it is decided that too low a supply voltage is present, and hence that a fault state is present. A drop in the supply voltage which is caused by a voltage drop across a possibly provided series resistor when the circuit unit has an increased drawn current is thus not regarded as erroneous and indicated by the detector signal until the supply voltage drops below the smaller second reference value. In this case, the second reference value can be matched to the maximum current drawn by the load, to the permissible minimum value for a supply voltage which has been applied (via the series resistor), and to the value of a series resistor which is normally used, such that the rms supply voltage applied between the connection terminals does not drop below this second reference value if there is no fault and if the externally applied supply voltage does not drop below its permissible minimum value.

The operating state of the load circuit unit can be detected in various ways.

If the integrated circuit arrangement contains, by way of example, an actuation signal which actuates the load circuit unit and which contains information about the operating state of this circuit unit or about an imminent change to the operating state, this actuation signal can be used in the undervoltage detector to change over the comparison threshold. In this case, the actuation signal is used as a forecast signal for an imminent change to the operating state and hence an imminent dip in the supply voltage.

An example of a circuit unit which changes from a first operating state with a relatively low drawn current to a second operating state with an increased drawn current as stipulated by an actuation signal is a circuit unit with a power MOSFET and an associated driver circuit. In such a circuit, the MOSFET changes its switching state as stipulated by an actuation signal under the actuation of the driver circuit. This change in the switching state normally requires an intermittently increased drawn current in the driver circuit until the gate capacitance of the MOSFET has reversed its charge accordingly.

The load circuit unit may also have a measurement circuit which is actuated by the actuation signal and which starts a measurement routine, which requires an increased drawn current, as stipulated by the actuation signal.

If the integrated circuit arrangement does not contain a suitable actuation signal from which it is possible to take information about the operating state of the load circuit unit, a further embodiment has provision for an operating state detector which is coupled to this circuit unit and which produces an operating state signal which is dependent on the operating state and which is supplied to the undervoltage detector. To produce this operating state signal, the operating state detector can ascertain the current flowing into the load circuit unit, for example.

The present invention is explained in more detail below with reference to figures.

In the figures, unless stated otherwise, components and signals which have the same meaning are denoted by the same reference symbols.

FIG. 1 shows a first exemplary embodiment of an inventive integrated circuit arrangement 1. This circuit arrangement is integrated in a semiconductor chip and can have contact made with it externally via connection terminals (not shown in more detail).

Figure 2:
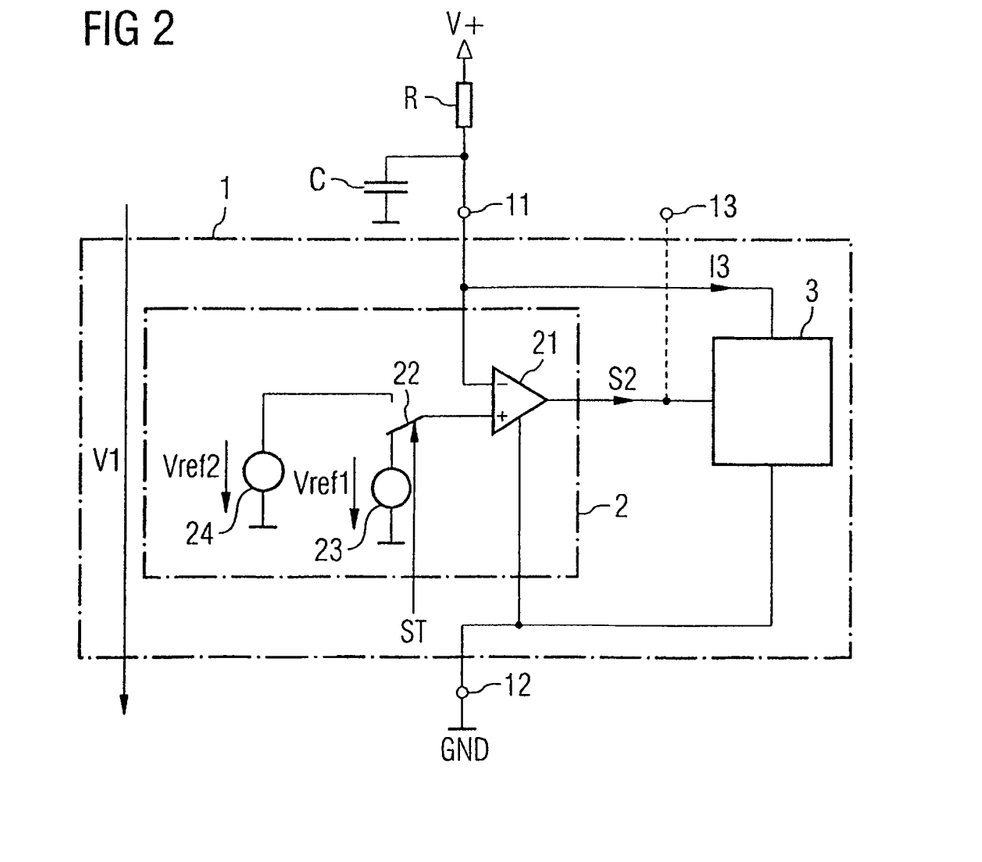
FIG. 2 shows an inventive integrated circuit arrangement with a load circuit unit and an undervoltage detector which assesses a supply voltage using a first or a second reference value, depending on an operating state of the circuit unit.

The circuit arrangement has supply voltage terminals 11, 12 between which a supply voltage can be applied. In FIG. 2, V1 denotes an rms supply voltage for the integrated circuit arrangement, which voltage is applied between these connection terminals 11, 12. This rms supply voltage V1 results from a supply voltage V+ which, in the example, takes reference-ground potential GND as a reference and which is applied to the supply voltage terminals 11, 12 via a series resistor R. To this end, a first supply voltage terminal 11 is connected to a positive supply potential V+ via the series resistor R, and the second supply voltage terminal 12 is connected to reference-ground potential GND.

In the integrated circuit arrangement 1, an undervoltage detector 2 is connected between the supply voltage terminals 11, 12 and is designed to detect an undervoltage, that is to say an excessively small rms supply voltage V1, and to provide a detector signal S. Regardless of whether an undervoltage is detected, the detector signal S2 assumes a first or a second signal level.

The rms supply voltage V1 feeds a load circuit unit 3, which is shown merely schematically as a circuit block in FIG. 2. This circuit unit, which is subsequently called the load circuit unit, can assume at least two different operating states: a first operating state with a first drawn current and a second operating state with a second drawn current, which is increased in comparison with that of the first operating state. The drawn current corresponds to the input current I3 which the circuit unit 3 draws via the supply voltage terminals 11, 12. In this context, it should be noted that "first drawn current" and "second drawn current" are not necessarily to be understood to mean constant drawn currents, but rather that they can also be understood to mean ranges within which the input current can vary.

The undervoltage detector 2 is designed to compare the rms supply voltage V1 applied between the supply voltage terminals 11, 12 either with a first reference voltage Vref1 or with a second reference voltage Vref2, depending on the operating state of the circuit unit 3, in order to produce the detector signal S2. In the exemplary embodiment, this detector signal S2 is supplied to the circuit unit 3 in order to disconnect the circuit unit 3 if the undervoltage detector detects an undervoltage between the connection terminals 11, 12. The level which the detector signal S2 assumes when such an undervoltage is detected is subsequently called the fault level. This fault level is dependent on the circuit implementation and, in the case of the circuit shown in FIG. 2, corresponds to a high level for the detector signal S2. The detector signal S2 can alternatively or additionally also be routed to the outside, which is shown in dashes in FIG. 2, in order to supply it to further circuit arrangements (not shown).

The undervoltage detector shown compares the rms supply voltage V1 with a first reference value Vref1 during the first operating state of the circuit unit 3 and with a smaller reference value Vref2 during a second operating state, in which the circuit unit 2 has an increased drawn current. During the first operating state, a drop in the supply voltage V1 below the first reference value Vref1 thus suffices to produce a fault level for the detector signal S2, whereas during the second operating state the rms supply voltage V1 needs to drop below the smaller reference value Vref2 in order to produce a fault level for the detector signal S2. If the drawn current I3 in the circuit unit 3 rises, the voltage drop across the series resistor R increases and the rms supply voltage V1 is reduced. Since the comparison threshold for producing a fault level for the detector signal S2 is lowered in the inventive circuit arrangement during the second operating state, in which the circuit unit 3 has an increased drawn current, the increased drawn current during this second operating state does not erroneously result in a fault level for the detector signal S2.

With reference to FIG. 2, the undervoltage detector 2 with the functionality explained has a comparator 21, one input (in the example the negative input) of which is supplied with the rms supply voltage V1 and the other input (in the example the positive input) of which is supplied via a switch arrangement 22 either with the first reference voltage Vref1 provided by a first reference voltage source 23 or with the second reference voltage Vref2 provided by a second reference voltage source 24. The switch arrangement 22, which changes over between the two reference voltage sources 23, 24 is actuated by an operating state signal ST. This operating state signal ST represents the operating state of the load circuit unit 3 and can be produced in different ways depending on the type of this circuit unit 3, as will be explained below.

Figure 3:
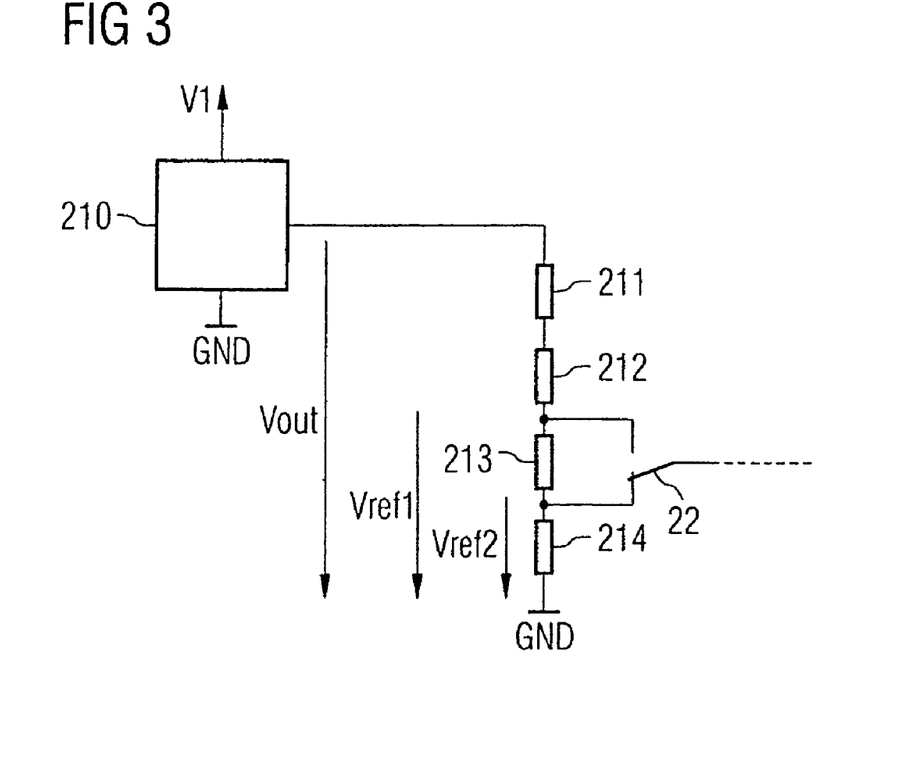
FIG. 3 shows an implementation example of a voltage source arrangement for producing a first and a second reference voltage.

To provide the two reference voltages Vref1, Vref2, the undervoltage detector shown in FIG. 2 has two reference voltage sources 23, 24, these being merely representative of a multiplicity of different implementation options, however. A particularly simple-to-implement circuit for providing two reference voltages Vref1, Vref2 is shown in FIG. 2. This circuit arrangement comprises a reference voltage source 210, for example the bandgap circuit, which provides an output voltage Vout. To produce this reference voltage Vout, the voltage source 210 is supplied with the rms supply voltage V1, for example. Connected between the output of this voltage source 210 and reference-ground potential GND is a series circuit comprising a plurality of, preferably temperature-stable, resistors 211-214. In this case, different reference potentials can be tapped off at the connecting node between two adjacent resistors in this series circuit. In the example, the second reference voltage Vref2 can be tapped off across the resistor chain's resistor 214, which is directly at reference-ground potential, while the first reference voltage Vref1 can be tapped off across the series circuit comprising this resistor 214 and the resistor 213, which is connected directly adjacent thereto.

Figure 4:
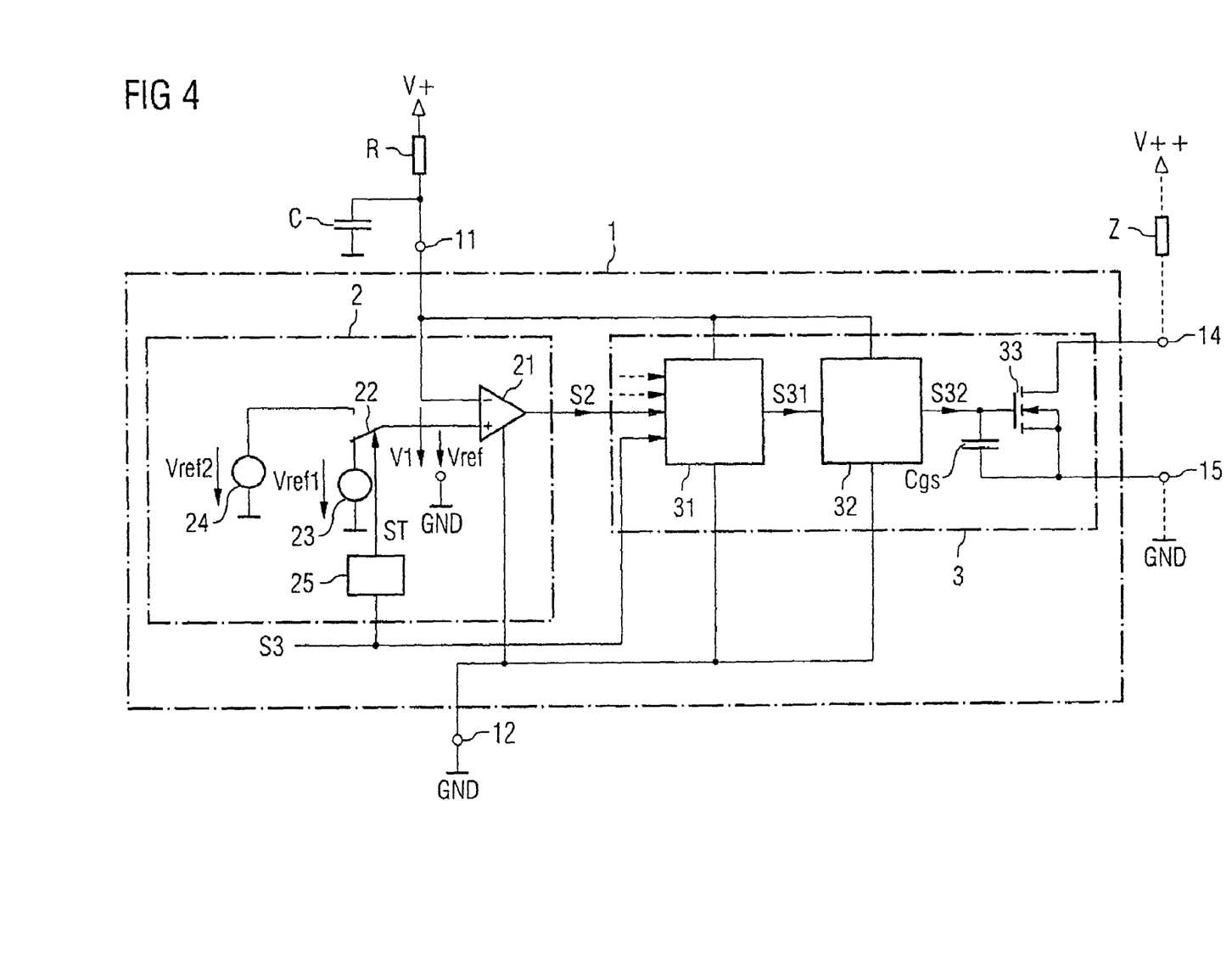
FIG. 4 shows an inventive integrated circuit arrangement with a load circuit unit which has a power MOSFET and in which an operating state signal is produced from an actuation signal from the circuit unit.

To explain a production option for the operating state signal ST, FIG. 4 shows an exemplary embodiment of an integrated circuit arrangement in which the load circuit unit has a power MOSFET 33, a driver circuit 32 for the power MOSFET 33 and a logic circuit 31 connected to the driver 32. The driver circuit 32 is designed to convert a signal S31 which is present at the output of the logic circuit 31 into an actuation signal S32 with a level which is suitable for actuating the power MOSFET 33. This power MOSFET 33, whose drain and source connections can have contact made with them from outside the integrated circuit 1 via connection terminals 14, 15, serves, by way of example, to operate a load Z which, for the purposes of illustration in FIG. 4, is connected in series with the drain-source path of the power MOSFET 33 between a terminal for a load supply potential V++ and the power MOSFET. The load supply voltage V++ and the supply voltage V+ of the integrated circuit may be either different voltages or the same voltages, depending on the load.

In the circuit shown in FIG. 4, the power MOSFET 33 is used as a low-side switch, that is to say that one of the connections of the MOSFET 33 is at negative supply potential or reference-ground potential GND. It goes without saying that such a power MOSFET can also be used as a high-side switch, in which case the load is between the MOSFET and the reference-ground potential GND. The driver circuit 32 is matched to the desired use of the MOSFET in the low-side or high-side switch, with the use of the MOSFET 33 as a high-side switch in the driver 32 involving, by way of example, provision of a charge pump in order to be able to provide a sufficiently high actuation potential on the gate connection of the MOSFET 33.

Turning such a MOSFET on and off is sufficiently well known to require charge reversal in a gate-source capacitance Cgs provided internally in the MOSFET, said capacitance being shown explicitly for the purpose of better understanding in FIG. 4. When the MOSFET 33 is turned on, which requires the gate-source capacitance Cgs to be charged to a suitable actuation potential, a not inconsiderable charging current may be required, depending on the size of this capacitance, which is delivered by the driver power 32. This charging current which flows during the turned-on period can result in a not inconsiderable voltage drop across the series resistor R and hence in a drop in the rms supply voltage V1.

The turning-on of the MOSFET 33 is prompted by an actuation signal S3, which is either produced internally in the integrated circuit by further circuit units (not shown in more detail) or which is supplied externally by a further connection terminal. The load circuit unit 3 shown in FIG. 4 always has an increased drawn current during the turn-on operation, that is to say while the gate-source capacitance Cgs is being charged to a suitable actuation potential, and this is equivalent to the second operating state of this switching unit. During the remaining period of time, particularly also during the period of time during which the gate-source capacitance Cgs is being discharged to reference-ground potential GND in order to turn off the MOSFET 33, the circuit unit 3 has a lower drawn current, which is equivalent to the first operating state thereof.

In the circuit arrangement shown in FIG. 4, use is made of the fact that the second operating state, that is to say the increased drawn current, is initiated by the actuation signal S3. This actuation signal S3 is therefore supplied to the undervoltage detector 2 in order to produce the operating state signal ST. To produce the operating state signal ST, the undervoltage detector 2 has a timer 25, whose manner of operation is explained below with reference to FIG. 5.

For the purposes of explanation, it will be assumed that this actuation signal S1 assumes a high level at a time t1 in order to turn on the MOSFET 33 via logic unit 31 and the driver circuit 32. A changeover period, that is to say the period of time during which the MOSFET changes from the off to the on state and during which the drawn current is increased, is prescribed particularly by the properties of the MOSFET 33 and can be taken from datasheets for such components, in particular.

Figure 5A:
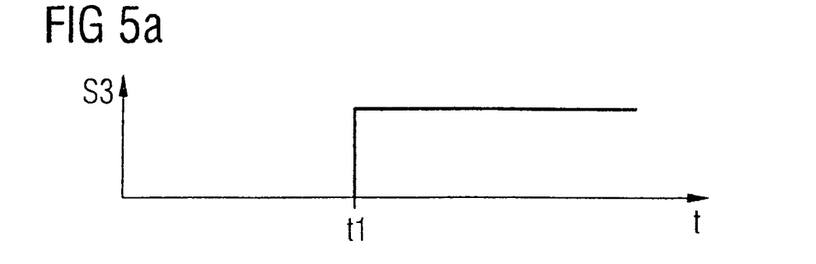
FIG. 5 shows examples of waveforms for selected signals in a circuit arrangement shown in FIG. 4.
Figure 5B:
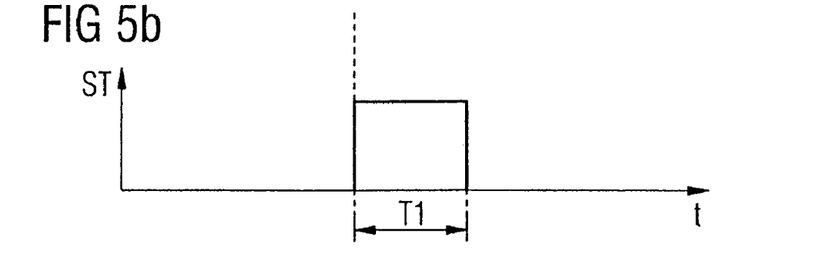
Figure 5C:
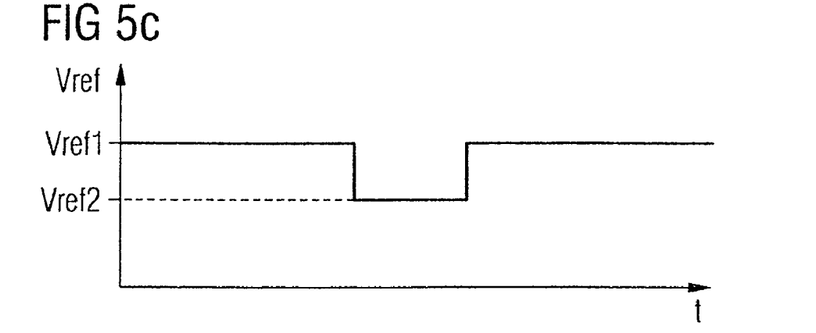

For a prescribed period of time after a rising edge of this actuation signal S3, the comparator 21 is supplied with the smaller second reference signal Vref2 for comparison with the rms supply voltage V1. To this end, for a prescribed period of time T1 after this rising edge, the timer 25 produces a level for the state signal ST which prompts the switching unit 23 to supply the second reference voltage Vref2 to the comparator 21. In this case, this period of time T1 is preferably chosen to be longer than the changeover period of the MOSFET 33, so that the increased drawn current of the circuit unit 3 is at an end at this end of this period of time T1—when the first reference voltage Vref1 is adopted again. In this circuit arrangement shown in FIG. 4, the second operating state is thus ascertained indirectly via the actuation signal S3, which initiates this second operating state, and in knowledge of the period of time for which this second operating state is normally present, in order to produce the operating state signal ST. Besides the waveform of the actuation signal S3 which is shown in FIG. 5a, FIG. 5b shows the waveform of the operating state signal ST derived from the actuation signal S3, and FIG. 5c shows the waveform of the reference voltage Vref applied to the second input of the comparator 21. During the period of time Ti after the rising edge of the actuation signal S3, this reference voltage Vref corresponds to the second reference signal Vref2 and otherwise to the first reference signal Vref1, as explained.

Figure 6:
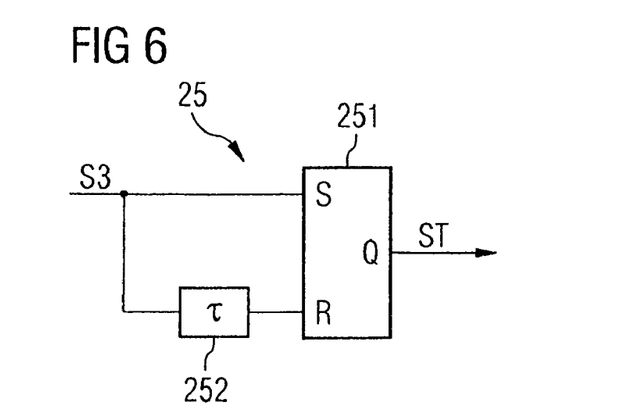
FIG. 6 shows an implementation example of a timer in the undervoltage detector shown in FIG. 5.

FIG. 6 shows a circuit implementation example of the timer 25 shown in FIG. 4. In this regard, the timer has an RS flipflop 251 whose Set input S is supplied with the actuation signal S3 and whose reset input R is supplied with the actuation signal S3 after a delay via a delay element 252. The output Q of this flipflop produces the operating state signal ST. The flipflop 251 is set upon a rising edge of the actuation signal S3 in order to produce a high level for the state signal ST, and is reset following a time delay after this rising edge of the actuation signal S3 in order to produce the low level for the operating state signal ST. The period of time during which the operating state signal ST is at a high level is dependent on the delay time of the delay element 252. This delay time is chosen, with reference to the signal waveforms shown in FIG. 5, such that it corresponds to the period of time T1.

For the sake of completeness, it should be pointed out that the logic unit 31 can be designed, by way of example, to turn off the MOSFET 33 via the driver circuit 32, regardless of the level of the actuation signal S3, when the detector signal S2 is at a fault level, that is to say when the rms supply voltage V1 drops below the first or second reference value Vref1, Vref2, depending on the operating state of the circuit unit 3. As indicated by the dashed arrows in FIG. 4, the logic unit 31 can be supplied not only with the actuation signal S3 and the detector signal S2 but also with further control signals which are produced by protective circuits (not shown in more detail) in the MOSFET 33, such as an overtemperature protection circuit or an overvoltage protection circuit. These control signals are used to actuate the MOSFET 33 in suitable fashion when an exceptional state is detected by the protective circuits explained, in order to protect a connected load or to prevent damage.

Figure 8:
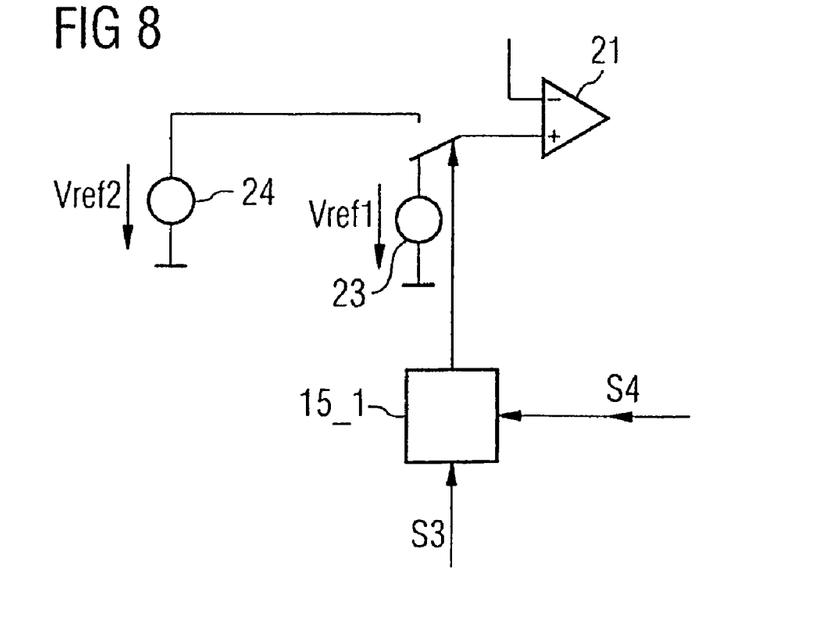
FIG. 8 shows a modification of the undervoltage detector shown in FIG. 4.

With reference to FIG. 8, a logic circuit 25_1 can also be provided, instead of the timer 25, in order to provide the status signal ST. This logic circuit 25_1 is supplied with a first control signal, which indicates the start of the second operating state or an imminent change from the first to the second operating state, and with a second control signal, which indicates the end of the second operating state.

By way of example, the logic circuit 26 is a flipflop which is set by the first control signal and is reset by the second control signal. The output signal from this flipflop forms the operating state signal ST.

In this case, the first control signal may be the control signal S3 which has already been explained beforehand. By way of example, the second control signal S4 can be produced by the power MOSFET 33 on the basis of a load current. In the circuit shown in FIG. 4, it can be assumed that the operating state with increased drawn current in the circuit 3 has concluded if the MOSFET 33 is on to such an extent that its load current exceeds a prescribed threshold value. To produce the second control signal S4, it is thus sufficient to ascertain the load current with the prescribed threshold value.

To protect the power MOSFET from overload, it is usual to monitor the load current flowing through it permanently in order to disconnect the MOSFET in the event of an overload. A current-measurement signal which is present anyway can then easily be used to produce the second control signal.

Figure 7:
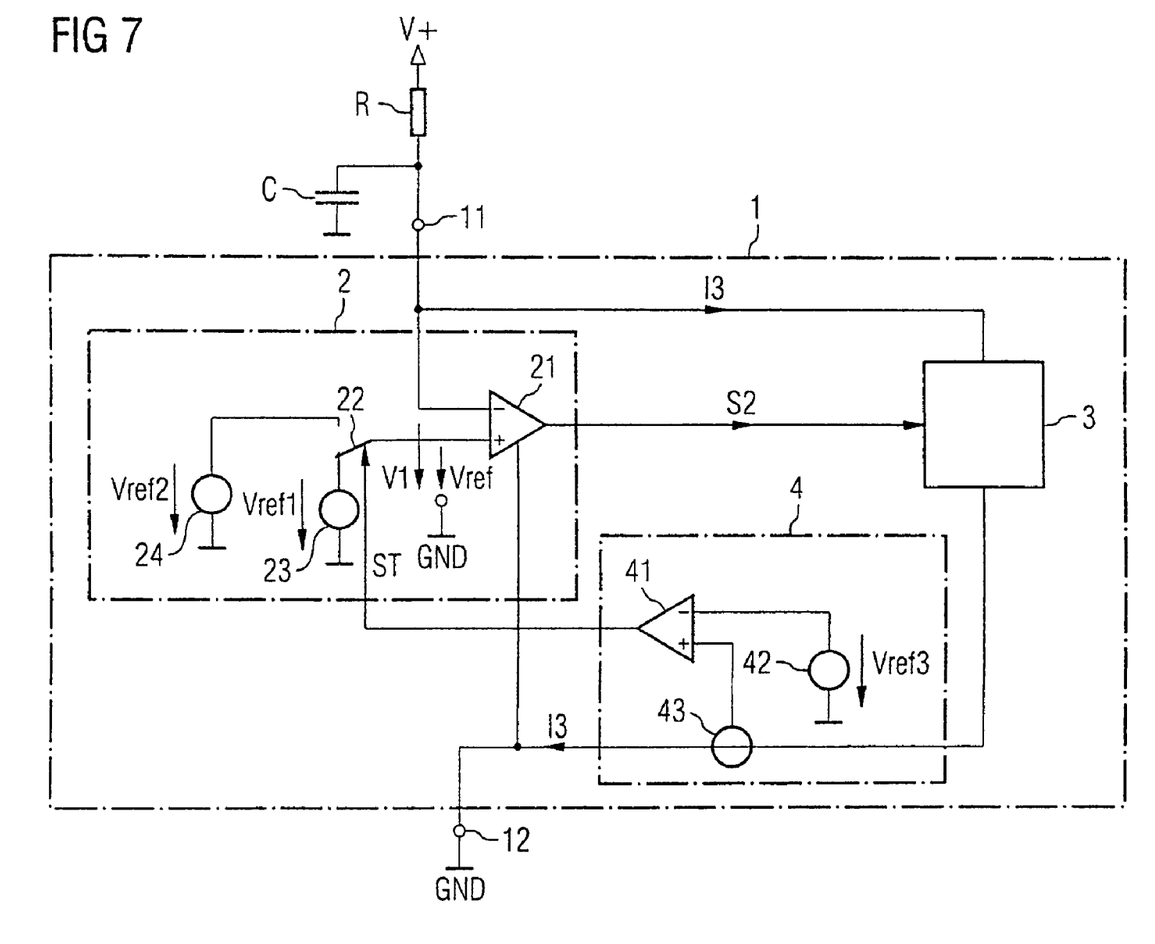
FIG. 7 shows an inventive integrated circuit arrangement with an operating state detector which is coupled to the load circuit unit and which produces an operating state signal by evaluating a drawn current in the load circuit unit.

FIG. 7 shows an integrated circuit arrangement with an alternative solution option for producing the operating state signal ST. The load circuit unit is shown merely schematically as a circuit block 3 in FIG. 7, this circuit block being representative of any integrated circuits which can assume at least one first operating state or a second operating state and in which the drawn current of the two operating states is different.

To ascertain the operating state signal ST, this circuit arrangement is provided with an operating state detector 4 which ascertains the drawn current in the circuit unit 3 by virtue of the input current I3 being detected by a current measuring arrangement 43. The resultant measurement signal S43 is compared with a reference signal Vref3, in the example a reference voltage, using a comparator 41, in order to produce the operating state signal ST. In the example shown in FIG. 7, the operating state signal ST assumes a high level if the drawn current I3 is above a threshold value at which the current measurement signal S43 is greater than the reference value Vref3. The switch arrangement 22 is changed over independently of the operating state signal ST in the manner already explained by virtue of the comparator 21 being supplied with the first reference signal Vref1 during the operating state where the drawn current is small and with the second reference signal Vref2 during the operating state where the drawn current is higher.

In summary, the inventive circuit arrangement involves an undervoltage for a supply voltage supplied to the circuit arrangement being detected on the basis of the operating state of a load circuit unit which is supplied with power by the supply voltage. In this case, the threshold at which it is decided whether there is an undervoltage present is lowered for operating states with increased drawn current in order that a drop in the supply voltage which results from a voltage drop across a series resistor is not mistakenly detected as an erroneous undervoltage. In the inventive circuit arrangement, operational dips in the supply voltage are thus not detected as erroneous dips in this supply voltage which occur when a line is broken, for example. In addition, the inventive circuit arrangement may be provided with relatively large external series resistors, which improves the protection for the integrated circuit. Furthermore, the external storage capacitor (reference symbol C in the figures) may be implemented in a smaller form than in conventional integrated circuits of this type.

LIST OF REFERENCE SYMBOLS

1 Integrated circuit arrangement
4 Operating state detector
11, 12 Connection terminals, supply voltage terminals
14, 15 Load connection terminals of the MOSFET
20 Undervoltage detector
21 Comparator
22 Switch arrangement
23, 24 Reference voltage sources
25 Timer
30 Load circuit unit
31 Logic unit
32 Driver circuit
33 Power MOSFET
41 Comparator
42 Reference voltage source
43 Current measuring arrangement
210 Reference voltage source
214-211 Resistors
251 RS flipflop
252 Delay element
C Buffer capacitor
Cgs Gate-source capacitance
GND Reference-ground potential
I1 Input current for the integrated circuit arrangement
I3 Input current for the load circuit unit
R Resistor
S2 Detector signal
S3 Actuation signal
S31, S32 Control signals
ST Operating state signal
V+ Supply voltage
V++ Supply voltage for the load
V1 rms supply voltage
Vout Output voltage from the reference voltage source
Vref1 First reference voltage, first reference value
Vref2 Second reference voltage, second reference value
Vref3 Reference value, reference voltage

The invention claimed is:

1. An integrated circuit arrangement comprising:
   connection terminals configured to receive a supply voltage,
   an undervoltage detector coupled between the connection terminals and configured to compare the supply voltage with a select reference value selected from a first reference value and a second reference value, the second reference value less than the first reference value, and to produce a detector signal on the basis of a result of the comparison,
   at least one circuit unit coupled between the connection terminals, the at least one circuit unit including at least one first operating state with a first drawn current and a second operating state with a second drawn current, the second drawn current exceeding the first drawn current, wherein the select reference value corresponds to the first reference value during the first operating state, and corresponds to the second reference value during the second reference state.

2. The circuit arrangement as claimed in claim 1, wherein the undervoltage detector comprises:
   a comparator having a first input configured to receive the supply voltage, a second input and an output to which the detector signal is provided,
   a voltage source arrangement configured to provide first and second reference voltages,
   a changeover element coupled between the voltage source arrangement and the second input of the comparator and which supplies the second input with the select reference value in the form of a select one of the first and second reference voltages.

3. The circuit arrangement of claim 2 wherein the changeover element supplies the select reference value responsive to a switching signal.

4. The circuit arrangement as claimed in claim 3, wherein an actuation signal influencing the operating state of the at least one circuit unit is supplied to the undervoltage detector in order to produce the switching signal.

5. The circuit arrangement as claimed in claim 4, wherein the undervoltage detector is configured to compare the supply voltage with the second reference value and otherwise with the first reference value for a prescribed period of time after a prescribed edge of the actuation signal.

6. The circuit arrangement as claimed in claim 4, wherein the at least one circuit unit includes a switching unit.

7. The circuit arrangement as claimed in claim 6, wherein the switching unit includes a semiconductor switching element and a driver circuit for the semiconductor switching element, the driver circuit operable to turn the semiconductor switching element on or off on the basis of the actuation signal.

8. The circuit arrangement as claimed in claim 1, wherein the at least one circuit unit includes a switching unit having a semiconductor switching element.

9. The circuit arrangement as claimed in claim 1, further comprising an operating state detector coupled to the at least one circuit unit and which produces an operating state signal which is dependent on the operating state and which is supplied to the undervoltage detector.

10. The circuit arrangement as claimed in claim 9, wherein the operating state detector is configured to determine an input current flowing into the at least one switching unit and to provide the operating state signal on the basis of the determined input current.

11. An integrated circuit arrangement comprising:
   connection terminals configured to receive a supply voltage,
   a comparator having a first input configured to receive the supply voltage, a second input and an output to which the detector signal is provided, the second input configured to receive a select reference voltage from a first reference voltage and a second reference voltage, the second reference voltage less than the first reference voltage, and to produce a detector signal on the basis of a result of the comparison,
   at least one switching circuit coupled between the connection terminals and includes at least one first operating state with a first drawn current and a second operating state with a second drawn current, the second drawn current exceeding the first drawn current,
   wherein the select reference voltage corresponds to the first reference value during the first operating state, and corresponds to the second reference value during the second reference state.

12. The circuit arrangement as claimed in claim 11, further comprising:
   a voltage source arrangement configured to provide first and second reference voltages,
   a switching device coupled between the voltage source arrangement and the second input of the comparator and which supplies the second input with the select reference voltage.

13. The circuit arrangement as claimed in claim 12 wherein the switching device supplies the select reference voltage responsive to a switching signal.

14. The circuit arrangement as claimed in claim 13, wherein the switching signal corresponds to an actuation signal influencing the operating state of the at least one switching circuit.

15. The circuit arrangement as claimed in claim 14, further comprising a timer coupled to receive the actuation signal and configured to provide the switching signal based on the actuation signal.

16. The circuit arrangement as claimed in claim 15, wherein the timer is configured to generate the switching signal such that the first reference voltage is supplied to the second input of the comparator for a prescribed period of time after a prescribed edge of the actuation signal.

17. The circuit arrangement as claimed in claim 16, wherein the at least one switching circuit further includes a semiconductor switching element and a driver circuit for the semiconductor switching element, the driver circuit operable to turn the semiconductor switching element on or off on the basis of the actuation signal.

18. The circuit arrangement as claimed in claim 16, wherein the at least one switching circuit further includes a semiconductor switching element and a driver circuit for the semiconductor switching element, the driver circuit operable to turn the semiconductor switching element on or off on the basis of the actuation signal.

19. The circuit arrangement as claimed in claim 12, further comprising an operating state detector coupled to the at least one switching circuit and which produces an operating state signal which is dependent on the operating state and which is supplied to control the switching device.

20. The circuit arrangement as claimed in claim 19, wherein the operating state detector is configured to determine an input current flowing into the at least one switching circuit and to provide the operating state signal on the basis of the determined input current.

* * * * *